United States Patent
Rahman

(10) Patent No.: US 8,546,191 B2
(45) Date of Patent: Oct. 1, 2013

(54) DISPOSING UNDERFILL IN AN INTEGRATED CIRCUIT STRUCTURE

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 3 days.

(21) Appl. No.: 12/958,309

(22) Filed: Dec. 1, 2010

(65) Prior Publication Data

US 2012/0139102 A1    Jun. 7, 2012

(51) Int. Cl.
*H01L 21/60* (2006.01)
(52) U.S. Cl.
USPC .... 438/121; 257/737; 257/724; 257/E21.506; 257/E23.021; 438/123; 438/122; 438/120
(58) Field of Classification Search
USPC ............... 257/724, 723, 778, 737, 686, 664, 257/795, 783, 788; 438/120, 124–127, 106, 438/108, 112, 570
See application file for complete search history.

(56) References Cited

U.S. PATENT DOCUMENTS

| | | | |
|---|---|---|---|
| 4,356,223 A | 10/1982 | Iida et al. | |
| 6,126,428 A * | 10/2000 | Mitchell et al. | 425/110 |
| 6,593,168 B1 | 7/2003 | Ehrichs et al. | |
| 6,727,583 B2 * | 4/2004 | Naka et al. | 257/724 |
| 6,734,567 B2 * | 5/2004 | Chiu et al. | 257/778 |
| 6,855,578 B2 * | 2/2005 | Odegard et al. | 438/120 |
| 6,897,096 B2 * | 5/2005 | Cobbley et al. | 438/123 |
| 7,294,533 B2 * | 11/2007 | Lebonheur et al. | 438/127 |
| 8,080,823 B2 * | 12/2011 | Katoh et al. | 257/48 |
| 2003/0001286 A1 | 1/2003 | Kajiwara et al. | |
| 2004/0169833 A1 | 9/2004 | Tanaka | |

FOREIGN PATENT DOCUMENTS

JP    2008-283004    11/2008

OTHER PUBLICATIONS

IPC, "Guideline for Selection and Application of Underfill Material for Flip Chip and other Micropackages", Draft 7, Underfill Adhesives for Flip Chip Applications Task Group (5-24f), J-STD-030, Dec. 2000, 24 pgs.
Salomon, Benjamin, "Capillary Underfill Manufacturing Development and Characterization for $2^{nd}$ Level Electronic Interconnect Processes", Master of Engineering in Management Systems Engineering, University of Puerto Rico, Mayaguez Campus, Dec. 2004, 103 pgs.

* cited by examiner

*Primary Examiner* — William F Kraig
*Assistant Examiner* — Sheng Zhu
(74) *Attorney, Agent, or Firm* — LeRoy D. Maunu

(57) ABSTRACT

In one embodiment, a method of forming a multi-die semiconductor device is provided. A plurality of dice is mounted on a semiconductor substrate, and neighboring ones of the dice are separated by a distance at which a first one of the neighboring dice will contact a meniscus of a flange of the neighboring die during underfill to form a capillary bridge between the neighboring dice. Solder bumps are reflowed to electrically connect contact terminals of the plurality of dice to contact terminals on a top surface of the substrate. Underfill is deposited along one or more edges of one or more of the plurality of dice. As a result of the capillary bridge formed between neighboring dice, flow of underfill is induced between the bottom surfaces of the neighboring dice and the top surface of the substrate. The dispensed underfill is cured.

12 Claims, 5 Drawing Sheets

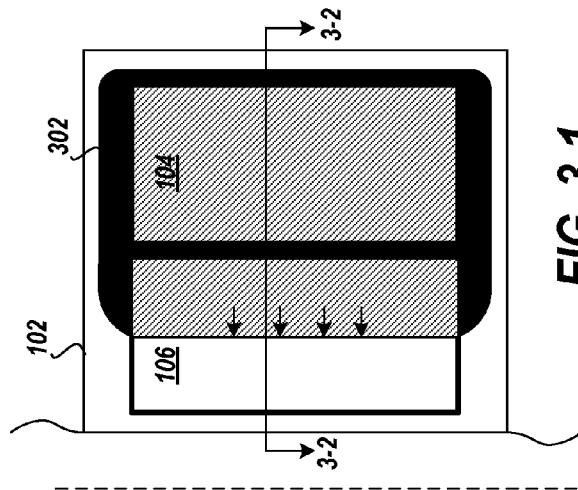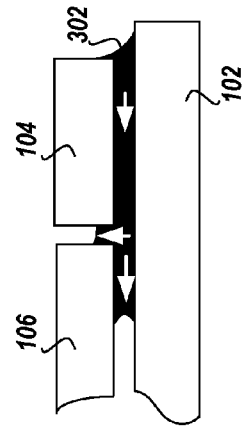
FIG. 3-1  FIG. 3-2
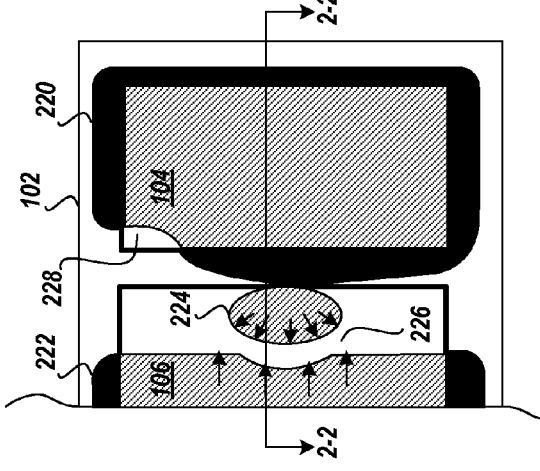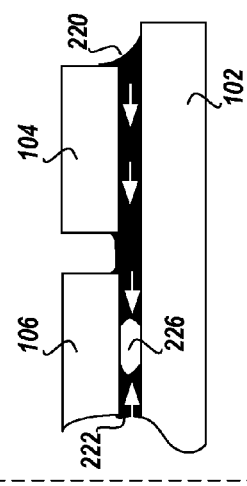
FIG. 2-1  FIG. 2-2
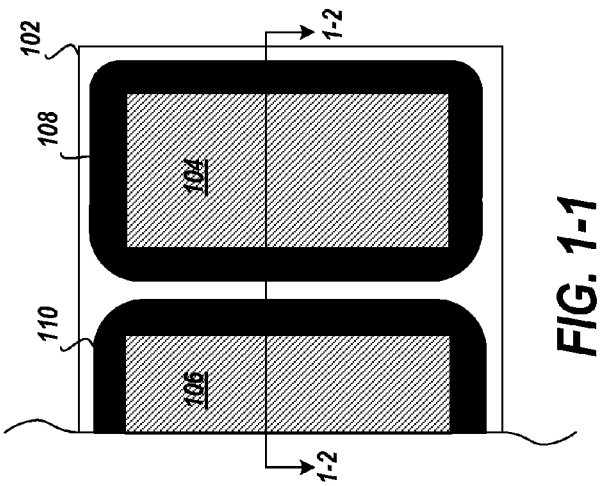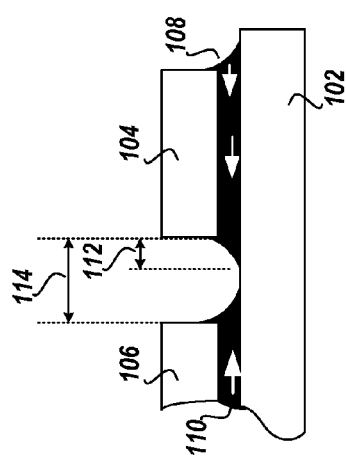
FIG. 1-1  FIG. 1-2

DISPOSING UNDERFILL IN AN INTEGRATED CIRCUIT STRUCTURE

FIELD OF THE INVENTION

One or more embodiments generally relate to integrated circuits, and more particularly, to the application of underfill to bond an integrated circuit die to a lower substrate.

BACKGROUND

There are a number of conventional processes for packaging integrated circuits. One approach, which is commonly referred to as "flip chip" packaging, generally contemplates forming solder bumps (or other suitable contacts) directly on an integrated circuit die. The die is then "flipped" and attached to a substrate such as a printed circuit board or substrate. The solder bumps on the die are aligned and mounted onto matching contacts on the substrate. The solder bumps are then reflowed to electrically connect the die to the substrate.

When a semiconductor device such as, e.g., a flip chip die is mounted to the substrate, an air gap typically remains between the die and substrate. This gap is commonly filled with material that flows into the gap in liquid form and then solidifies. This material is generally a mixture of an epoxy resin and small silica spheres and is often called underfill. The underfill is typically applied in liquid form from a dispenser at one edge of the die. The underfill then flows into the narrow gap due to capillary action and spreads across the flip chip die until finally the entire area of the gap between the die and substrate is filled.

A number of problems are associated with this underfill process. For example, the operation of applying underfill must be repeated for each flip chip mounted onto a substrate. Repeating such an operation many times during manufacturing significantly increases costs and limits manufacturing throughput. Additional challenges may be presented in methods that entail the underfill being dispensed with a needle along one side of each die. Capillary action draws the dispensed underfill underneath the die. However, flow of the underfill is difficult to control and may result in defects. For example, underfill flow between adjacent die may result in the formation of voids or non-uniform underfill density beneath the IC dice. These defects may induce stress due to uneven thermal expansion. Sufficient spacing is provided between adjacent dice to provide room for a needle to dispense the underfill along at least one edge of each die as well as to prevent uncontrolled flow of underfill between adjacent dice.

One or more embodiments of the present invention may address one or more of the above issues.

SUMMARY

In one embodiment, a method of forming a multi-die semiconductor device is provided. A plurality of dice is mounted on a semiconductor substrate, each die of the plurality of dice forms a respective capillary region between the die and the semiconductor surface. Neighboring dice of the plurality of dice are separated by a distance at which a first one of the neighboring dice will contact a meniscus of a flange of an underfill along the perimeter of a second one of the neighboring die during underfill to form a capillary bridge between the respective capillary regions. Solder bumps are reflowed to electrically connect contact terminals of the plurality of dice to contact terminals on a top surface of the substrate. Following the reflowing of the solder bumps, underfill is deposited along one or more edges of one or more of the plurality of dice. The underfill has properties that induce capillary action causing the underfill to flow between the bottom surfaces of the one or more dice and the top surface of the substrate and form the flange of the underfill along the perimeter of each of the one or more dice. As a result of the capillary bridge formed between neighboring dice, flow of underfill is induced between the bottom surfaces of neighboring dice and the top surface of the substrate. The dispensed underfill is cured.

In another embodiment, a semiconductor device is provided. The semiconductor device includes a semiconductor substrate having a plurality of contact terminals and respective solder bumps. A plurality of semiconductor dice are mounted to the semiconductor substrate, each die having a plurality of contact terminals electrically coupled to respective ones of the plurality of contact terminals of the semiconductor substrate via the corresponding solder bumps. Adjacent ones of the semiconductor dice are separated by a distance less than or equal to a capillary bridge distance. Underfill fills gaps between the plurality of semiconductor dice and the semiconductor substrate and at least partially fills gaps between each pair of adjacent ones of the semiconductor dice.

In yet another embodiment, a method of assembling a plurality of semiconductor dice on a substrate is provided. The plurality of dice is mounted on the semiconductor substrate. Each die of the plurality of dice is placed to form a respective capillary region between the die and the semiconductor surface. Neighboring ones of the plurality of dice are separated by a distance less than a capillary distance. The capillary distance is a distance at which a continuous capillary region is formed across all of the plurality of dice. Solder bumps are reflowed to electrically connect contact terminals of the plurality of dice to contact terminals on a top surface of the substrate. Following the reflowing of the solder bumps, underfill is deposited along one or more edges of the plurality of dice. The underfill has properties that induce capillary action, causing the underfill to be distributed across the continuous capillary region.

It will be appreciated that various other embodiments are set forth in the Detailed Description and Claims which follow.

BRIEF DESCRIPTION OF THE DRAWINGS

Various aspects and advantages of the disclosed embodiments will become apparent upon review of the following detailed description and upon reference to the drawings in which:

FIG. 1-1 illustrates underfill of two semiconductor dice on a substrate using minimum spacing conventions to prevent overflow;

FIG. 1-2 illustrates a cross section of the dice and substrate illustrated in FIG. 1-1 taken in direction 1-2;

FIG. 2-1 illustrates underfill of two semiconductor dice on a substrate using a die spacing that is insufficient to prevent overflow;

FIG. 2-2 illustrates a cross section of the dice and substrate shown in FIG. 2-1 taken in direction 2-2;

FIG. 3-1 illustrates the underfill flow of two semiconductor dice;

FIG. 3-2 illustrates a cross section of the dice and substrate shown in FIG. 3-1 taken in direction 3-2;

DETAILED DESCRIPTION

Figure 4:
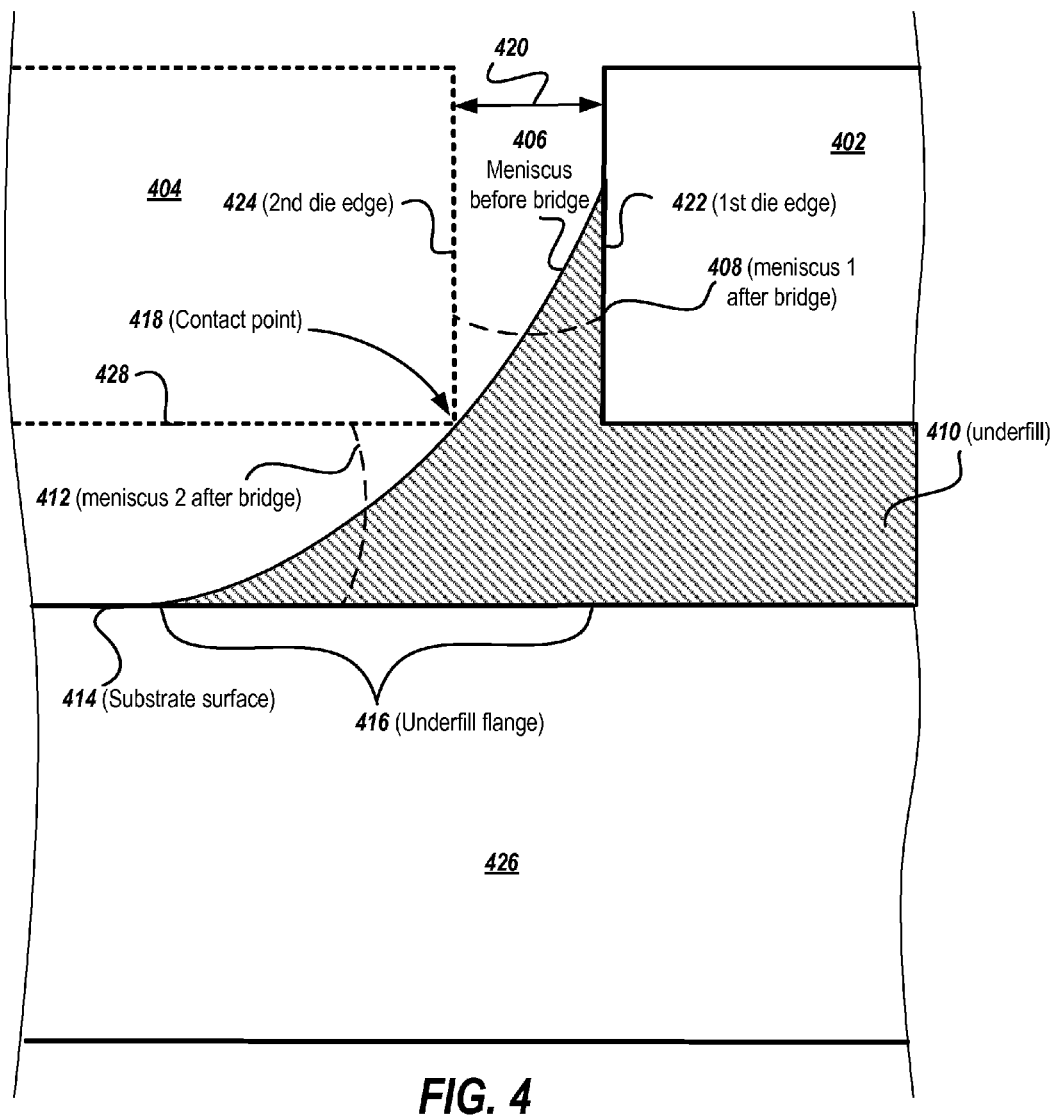
FIG. 4 illustrates formation of a capillary bridge between two dice during underfill.

Underfill is typically dispensed by needle along an edge of each die using an automated system. The underfill is drawn into the space under the die though capillary forces. Unless the needle positioning, movement and flow rate are all tightly controlled, there is a risk of the underfill flowing out from under one die onto or under adjacent dice or components. This is referred to as overflow, which may have several adverse effects. As explained in more detail below, overflow may cause voids or non-uniform underfill density, which may induce stress due to uneven thermal expansion. As a result, the life of the IC may be significantly shortened. To counter these concerns, previous methods separate adjacent die by a minimum distance to provide sufficient space to dispense underfill alongside each IC and provide a buffer area to avoid overflow to neighboring dice and other components. In this manner, adherence to the minimum spacing conventions allows multiple dice to be individually underfilled without overflow contaminations.

However, the minimum spacing conventions increase the area needed to place the dice on the substrate as well as increase the length of wire connections between the dice. The individual underfilling of semiconductor dice increases manufacturing time and resulting packaging costs. One or more embodiments discussed herein go against previous spacing conventions and underfill control methodology—placing dice drastically closer together to form a continuous capillary region across multiple adjacent dice. The disclosed underfill methodology achieves an unexpected control of underfill flow and allows dice to be spaced at closer distances.

To assist in the understanding of one or more embodiments disclosed herein, a brief description of fluid dynamics of the underfill process and problems associated therewith are discussed in relation to FIGS. 1-1, 1-2, 2-1, and 2-2. FIGS. 1-1 and 1-2 illustrate an example underfill of two dice on a substrate using minimum spacing conventions to prevent overflow. FIG. 1-1 shows a top view of two dice mounted on a substrate and FIG. 1-2 shows a cross section of FIG. 1-1 taken in the direction 1-2. In this example, two adjacent semiconductor dice 104 and 106 are mounted on a substrate 102. Underfill 108 is deposited on the right side of die 104 and flows to the left through the narrow gap between die 104 and substrate 102 due to capillary action. The underfill spreads beneath the die until the entire area of the gap between the die and substrate is filled. Likewise, underfill 110 is deposited on the left side of die 106 (not shown) and flows to the right under die 106. In this illustration, underfill on top of the substrate 102 is shown in black. Portions of the dice with underfill underneath are indicated by diagonal line shading.

When the underfill reaches the edge of each die, capillary force draws underfill laterally along the top surface of the substrate 102 and up the side of each die 104 and 106 until capillary forces are equalized by surface tension. As a result, an underfill flange is formed along the perimeter of each die. The flange 112 resulting from the deposit of underfill 108 is that portion of the underfill that extends beyond the edge of the dice as shown in FIG. 1-1. The flange may also be referred to as the fillet and such terms may be used interchangeably herein.

An underfill flange is recommended for nearly all applications to seal the bottom of the die, strengthen the bond, and prevent delamination underneath the die near the flange. If the flange is too small, delamination is more likely to occur. A typical flange may extend 30-100% up the edge of the die.

As underfill is drawn out from under a die to form a flange, surface tension contains the underfill and prevents the underfill from flowing away from the edge. However, when enough underfill is provided, and the flange becomes larger, the surface area will eventually break or, more typically, contact an adjacent material and flow away from the die perimeter. This is referred to as overflow. The problem of overflow is further complicated in that differences in the flow rate under a semiconductor die may cause the width of the flange to vary in at different locations. To avoid this scenario, dice may be separated by a minimum spacing 114. A typical minimum spacing is on the order of 1.0 mm.

It is generally understood that reducing the spacing between adjacent dice may induce overflow and result in a number of defects. FIGS. 2-1 and 2-2 illustrate underfill of two dice on a substrate with a die spacing insufficient to prevent overflow. FIG. 2-1 shows a top view of dice mounted on a substrate and FIG. 2-2 shows cross section of FIG. 2-1 taken in the direction 2-2. Like the example provided in FIGS. 1-1 and 1-2, underfill 220 is deposited on the right side of die 104 and flows to the left through the narrow gap between die 104 and substrate 102 due to capillary action. The underfill spreads beneath the die until the entire area of the gap between the die and substrate is filled. Likewise, underfill 222 is deposited on the left side of die 106 and is shown as flowing to the right under die 106. In this example, the flange formed by underfill 220 on the left perimeter of die 104 became wide enough to contact a surface on the right side of die 106. Underfill is drawn into the narrow gap between die 106 and substrate 102 due to capillary action as illustrated by underfill 224.

As one result of the overflow, underfill 224 may contact underfill 222. This may cause an air pocket or void 226 to form along the seam of the two propagating underfills. Such a void can create uneven thermal expansion under die 106 during operation of the dice and shorten the operable lifespan. Furthermore, if underfill 224 and underfill 222 do not cure into a seamless and uniform piece, uneven transfer of thermal stress may occur between dice 104 and 106.

The overflow may occur in part due to phase separation of the silicon filler and liquid carrier materials, which comprise the underfill. As a result, underfill 224 may not have the same dielectric or strength as non-separated underfill. This non-uniformity may also reduce the lifetime of the device.

As another result of the overflow, insufficient underfill may not be deposited to provide a complete bond for die 104. This is shown by void 228. Similarly, too much underfill may be deposited under die 106 resulting in another overflow and lead to further problems. In the above examples, underfill is deposited at opposite edges of dice 104 and 106. One skilled in the art will recognize that these and other complications may also occur when underfill is deposited using other deposition strategies as well.

Due in part to these complications, close spacing of die is avoided in previous underfill methods. One or more embodiments work contrary to conventional spacing methodology rules and concerns by drastically reducing the spacing between neighboring semiconductor dice. In these embodiments, the ICs are spaced close enough that the neighboring die will physically contact the flange of the first die to form a capillary bridge. A capillary bridge will be formed between these regions, thereby continuing the capillary action from one die to the next. Due to this capillary action, underfill flowing between adjacent dice can be controlled to allow multiple dice to be underfilled as though they were a single die. In this manner, a plurality of dice may be underfilled at the same time, eliminating the need for sequential underfill steps.

FIGS. 3-1 and 3-2 illustrate underfill of two dice on a substrate using a die spacing close enough to provide a capillary bridge between adjacent dice. FIG. 3-1 shows a top view of dice mounted on a substrate and FIG. 3-2 shows a cross section of FIG. 3-1 taken in the direction of 3-2. Dice 104 and 106 are separated by a distance that is even less than the separation illustrated in FIGS. 2-1 and 2-2, in which flow resulted in overflow. In this example, underfill 302 for both dice is deposited at the right edge of die 104. Conventional underfill may be used. Alternatively, the underfill may be specifically formulated for particular applications.

The underfill flows to the left through the narrow gap between die 104 and substrate 102 due to capillary action. As described in relation to FIGS. 1-1 and 1-2, when the underfill 302 reaches the edge of die 104, capillary force will continue to draw underfill laterally along the top surface of the substrate 102 and up the side the die 104 to form a flange. As the flange forms on the left edge of die 104, the close placement of die 106 causes die 106 to contact the flange across the entire shared edge. As a result, a capillary bridge is formed and transfer of underfill 302 under die 106 is induced. As a result, underfill flows as though dice 104 and 106 were a single die.

FIG. 4 illustrates formation of a capillary bridge between adjacent dice mounted on a substrate. In this example, underfill 410 has been deposited between die 402 and substrate 426, resulting in a flange 416 on the left side of the die 402. As described above, when underfill 410 reaches the edge of each die in the deposition process, capillary force will continue to draw underfill laterally along the top surface 414 of the substrate 426 and along the edge 422 of die 402 until the capillary force is equalized by surface tension of meniscus 406. A capillary bridge is formed when an adjacent die 404 is placed in close enough proximity to contact the resulting meniscus 406 of flange 416 at contact point 418. Once contact is made, the surface area of the meniscus 406 is divided in two and a capillary bridge is formed. As a result capillary flow is induced upward along the edge 424 of die 404 and along the bottom surface 428 of die 404, leading to formation of first and second meniscuses 408 and 412. An upward capillary force is present at meniscus 408, and a horizontal capillary force is present at meniscus 412. As a result, underfill is drawn into the narrow space between die 404 and substrate 426.

In order to ensure a capillary bridge is formed, dice 402 and 404 should be separated by a distance 402 at which die 404 can be expected to contact meniscus 406 of the flange 416. As described above, the width of the flange may vary in different locations along the perimeter of the die. One skilled in the art will recognize that the flange width may be calculated, or determined through simulation, according to the underfill amount and parameters including, for example, viscosity, temperature, density, gap sizes between each die and between the dice and the substrate, and the area of each die. From this, a minimum and maximum flange width may be determined along with a maximum die spacing at which contact can be ensured. This maximum distance is referred to as the capillary bridge distance.

Figure 5:
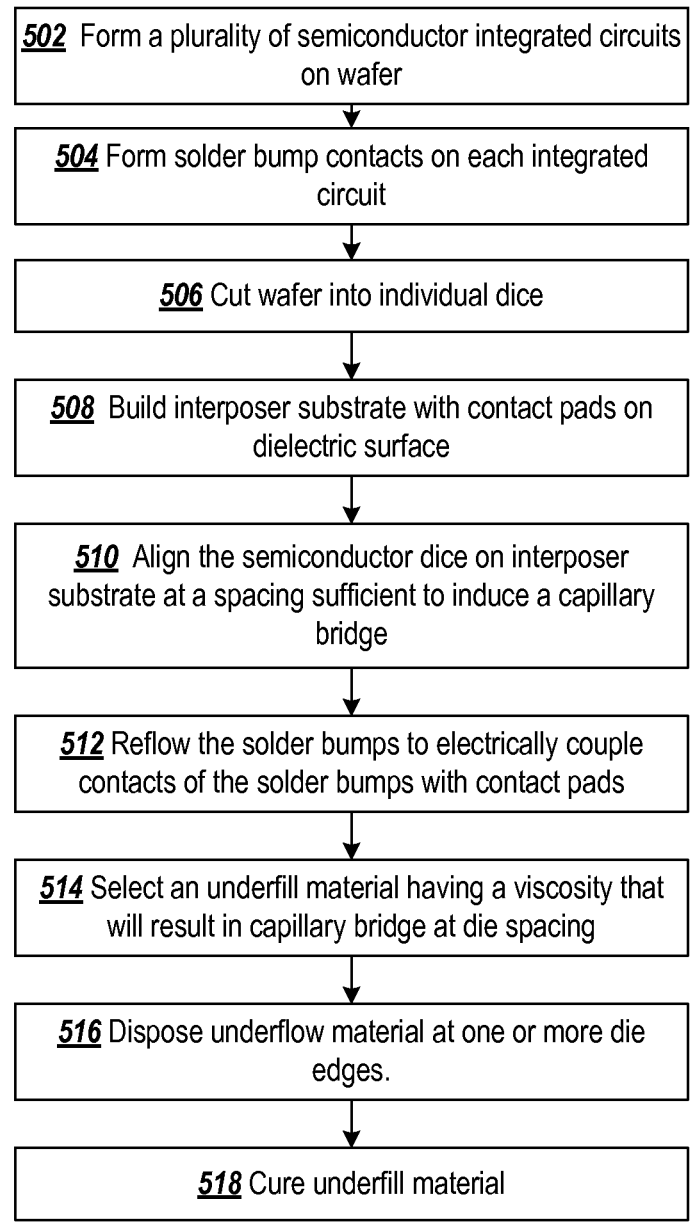
FIG. 5 illustrates a flowchart of an example process for formation of an IC package.

FIG. 5 shows a flowchart of an example process for formation of an IC package. A plurality of semiconductor integrated circuits is formed on a wafer at block 502. Solder bump contacts are formed on the integrated circuits at block 504. The wafer is cut into individual dice at block 506. In some implementations, the edges of the dice may also be smoothed to provide a uniform edge for aiding in the formation of capillary bridges and allowing the dice to be place closer to one another. An interposer substrate or other semiconductor substrate is formed at block 508 with contact pads formed on a dielectric surface of the substrate. The semiconductor dice are aligned on the interposer substrate with a spacing that will induce formation of a capillary bridge at block 510. The solder bumps are reflowed at block 512 to electrically couple contacts of the solder bumps with pads of the interposer substrate. An underfill is selected at block 514. The underfill is selected to have a viscosity and other properties that will produce a capillary bridge between adjacent dice at the die spacing. Underfill is disposed at one or more edges of one or more die at block 516. The underfill is then cured at block 518 to bond the dice to the interposer substrate.

One skilled in the art will recognize that the alignment of dice on the substrate performed at block 510 may require a fine alignment in order to achieve the close spacing of the semiconductor dice. Such precise alignment can be time consuming. In one embodiment, dice may be aligned on a substrate using a two-stage alignment. In a first stage, coarse alignment is performed using a first set of alignment targets. Once coarse alignment is completed, fine alignment is performed using a second set of alignment targets. Because larger targets and tolerances are used in coarse alignment, the process is generally faster. By performing coarse alignment to initially locate targets prior to fine alignment, alignment speed can be significantly improved in comparison to the use of fine grain alignment alone. Depending on the implementation, different sets of optics may be used in the alignment pick and place machine for coarse and finer alignment. The alignment accuracy depends on the resolution of optics and machine throughput.

Figure 6:
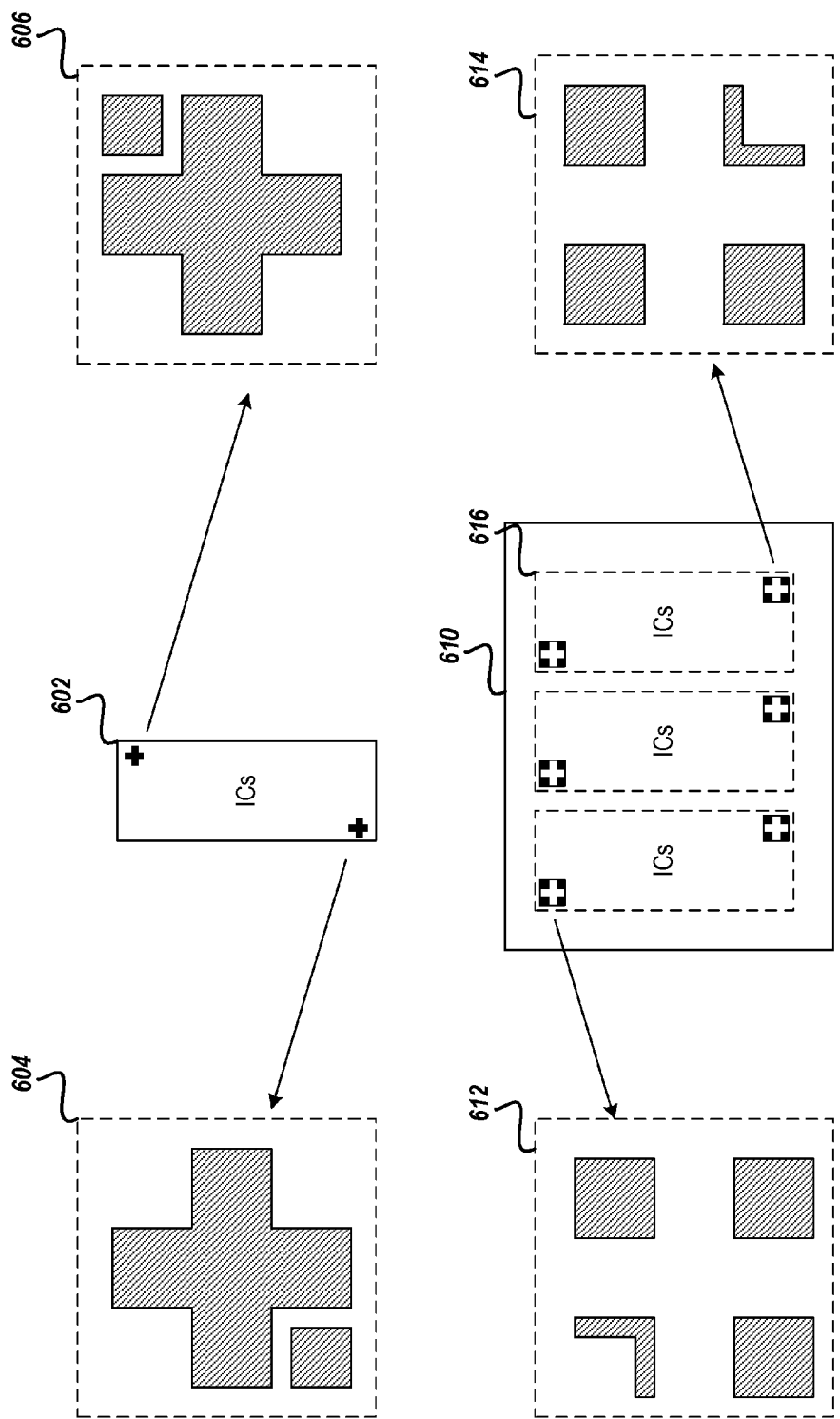
FIG. 6 shows an example set of targets that may be used for fine alignment of semiconductor dice on a substrate.

FIG. 6 shows an example set of targets that may be used for coarse and fine alignment of semiconductor dice on a substrate in accordance with one or more embodiments. A first set of targets 604 and 606 are etched on the top of each semiconductor die 602 and a complementary set of targets 612 and 614 is etched on a top surface of the substrate 610 to indicate an intended placement 616 of each semiconductor die 602. Targets 604 and 606 are etched in the positive and complementary targets 612 and 614 are etched in the negative to aid in differentiation of the targets during alignment. In this example, each target includes a cross shape and a small square. The square indicates the corner in which the target is placed. In one implementation, a different set of targets having different sizes are provided for fine and coarse alignment. In another implementation, the smaller target used for fine alignment may be etched in a square inside each larger target used for coarse alignment. One skilled in the art will recognize that the targets shown in FIG. 6 are provided for illustrative purposes and other targets generally known in the art may be utilized as well.

Figure 7:
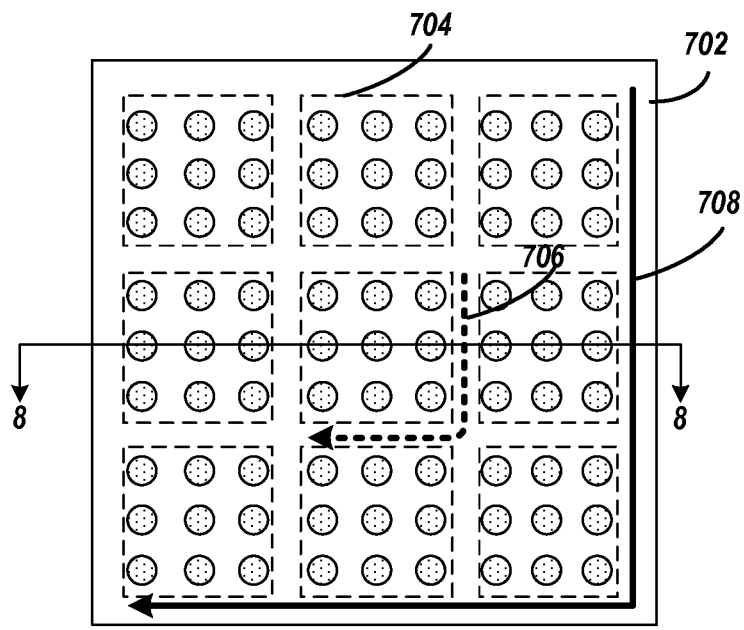
FIG. 7 shows a plurality of semiconductor dice mounted on an interposer substrate.

FIG. 7 shows an example plurality of dice mounted on a substrate. In this example, nine dice 704 are aligned and mounted on substrate 702. As illustrated in FIG. 7, the above embodiment presents new strategies for underfill deposition that are not possible using previous underfill methods. FIG. 7 shows an example deposition path 706 that may be used to deposit underfill alongside individual dice. However, if dice are spaced too closely for a needle to deposit underfill between adjacent dice, it may not be possible to deposit underfill alongside the center die using previous methods. By spacing dice close enough to induce a capillary bridge, one contiguous capillary region can be created across all of the dice 704. Due to the continuous capillary effect, underfill may be deposited along example path 708 to distribute underfill under all dice using capillary forces.

Figure 8:
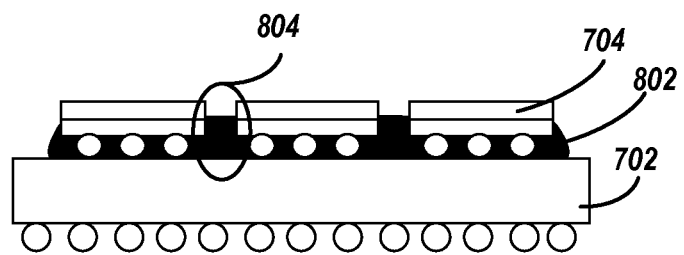
FIG. 8 shows a cross section of the semiconductor dice and interposer substrate shown in FIG. 7 after underfilling is performed.

FIG. 8 shows a cross section of the dice mounted on the substrate illustrated in FIG. 7 taken in direction 8. In this example, underfill 802 has been deposited and distributed between dice 704 and substrate 702. The seamless underfill bond provides a superior bond and tolerance to stresses produced by thermal expansion of the dice 704. As illustrated in region 804, an upward capillary effect may cause underfill to be distributed in the region between adjacent dice. In some implementations, this may help to contain extra underfill that is deposited and prevent overflow from occurring at an outside edge of the dice 704. Once cured, the underfill in this region may provide additional bond strength and help dissipate heat from the edges of the die.

One or more embodiments of the present invention are thought to be applicable to a variety of underfill applications. Other aspects and embodiments will be apparent to those skilled in the art from consideration of the specification. It is intended that the specification and illustrated embodiments be considered as examples only, with a true scope and spirit of the invention being indicated by the following claims.

What is claimed is:

1. A method of forming a multi-die semiconductor device, comprising:
   mounting a plurality of dice on a semiconductor substrate, each die of the plurality of dice forming a respective capillary region between the die and the semiconductor surface, and neighboring dice of the plurality of dice separated by a distance at which a first one of the neighboring dice will contact a meniscus of a flange of an underfill along a perimeter of a second one of the neighboring die during deposition of the underfill to form a capillary bridge between the respective capillary regions;
   reflowing solder bumps to electrically connect contact terminals of the plurality of dice to contact terminals on a top surface of the substrate;
   following the reflowing of the solder bumps, depositing the underfill along one or more edges of one or more of the plurality of dice;
   wherein the depositing of the underfill along the one or more edges includes depositing along an edge of one die of the plurality of dice a quantity of underfill that completely underfills the one die and a neighboring die of the plurality of dice, and the underfill having properties that induce capillary action causing the underfill to:
      flow between the bottom surfaces of the one or more dice of the plurality of dice and the top surface of the substrate;
      form the flange of the underfill along a perimeter of each of the one or more dice of the plurality of dice; and
      as a result of the capillary bridge formed between neighboring dice, flow between the bottom surfaces of the neighboring dice and the top surface of the substrate; and
   curing the dispensed underfill.

2. The method of claim 1, wherein the depositing of the underfill along the edge of the one die includes depositing a quantity of underfill that completely underfills the plurality of dice.

3. The method of claim 1, wherein the underfill flows under all of the plurality of dice via capillary action.

4. The method of claim 1, wherein the depositing the underfill along the edge of the one die includes depositing a quantity of underfill that fills channel regions between neighboring ones of the plurality of dice.

5. The method of claim 1, wherein for each one of the plurality of dice, the mounting includes:
   using a first set of alignment marks etched on the die and the semiconductor substrate to perform a low-precision alignment; and
   following the low precision alignment, using a second set of alignment marks etched on the die and the semiconductor substrate to perform a high-precision alignment.

6. The method of claim 5, wherein:
   the low-precision alignment is performed using a first set of optics; and
   the high-precision alignment is performed using a second set of optics, the second set of optics having a resolution higher than the first set of optics.

7. The method of claim 5, further comprising forming the first and second sets of alignment marks on each of the plurality of die and on the semiconductor substrate.

8. The method of claim 1, further comprising forming the solder bumps on the contact terminals on the plurality of dice.

9. The method of claim 1, further comprising smoothing edges of the plurality of dice.

10. The method of claim 1, wherein the neighboring dice of the plurality of dice are separated by a distance of 30 to 50 micrometers.

11. The method of claim 1, wherein the neighboring dice of the plurality of dice are separated by a distance of less than 30 micrometers.

12. A method of assembling a plurality of semiconductor dice on a substrate, the method comprising:
   mounting the plurality of dice on the substrate, each die of the plurality of dice forming a respective capillary region between the die and the substrate, neighboring dice of the plurality of dice separated by a distance less than a capillary distance, the capillary distance being a distance at which a continuous capillary region is formed between all of the plurality of dice and the substrate;
   reflowing solder bumps to electrically connect contact terminals of the plurality of dice to contact terminals on a top surface of the substrate; and
   following the reflowing of the solder bumps, depositing underfill along one or more edges of the plurality of dice, wherein the underfill allows capillary action across the continuous capillary region;
   wherein the depositing of the underfill along the one or more edges includes depositing along an edge of one die of the plurality of dice, a quantity of underfill that completely underfills the one die and a neighboring die of the plurality of dice.

* * * * *